US010367636B2

(12) United States Patent
Aleksic et al.

(10) Patent No.: US 10,367,636 B2
(45) Date of Patent: Jul. 30, 2019

(54) PHASE CALIBRATION OF CLOCK SIGNALS

(71) Applicant: Rambus Inc., Sunnyvale, CA (US)

(72) Inventors: Marko Aleksic, Mountain View, CA (US); Simon Li, Cupertino, CA (US); Roxanne Vu, San Jose, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 16/156,868

(22) Filed: Oct. 10, 2018

(65) Prior Publication Data

US 2019/0173661 A1 Jun. 6, 2019

Related U.S. Application Data

(63) Continuation of application No. 15/659,394, filed on Jul. 25, 2017, now Pat. No. 10,129,015, which is a continuation of application No. 15/176,864, filed on Jun. 8, 2016, now Pat. No. 9,755,819.

(60) Provisional application No. 62/187,742, filed on Jul. 1, 2015.

(51) Int. Cl.
*H04L 7/033* (2006.01)
*H03L 7/081* (2006.01)
*H04L 7/00* (2006.01)
*H04L 25/03* (2006.01)
*H04L 25/02* (2006.01)

(52) U.S. Cl.
CPC .............. *H04L 7/033* (2013.01); *H03L 7/081* (2013.01); *H04L 7/0079* (2013.01); *H04L 25/03* (2013.01); *H04L 7/0004* (2013.01); *H04L 7/0337* (2013.01); *H04L 25/0292* (2013.01); *H04L 2025/03802* (2013.01)

(58) Field of Classification Search
CPC ....... H04L 25/0292; H04L 2025/03802; H04L 25/03019; H04L 25/03885
USPC .......................................................... 375/371
See application file for complete search history.

(56) References Cited

U.S. PATENT DOCUMENTS

| 7,099,424 | B1 * | 8/2006 | Chang ...................... H03L 7/07 |
| | | | 375/370 |
| 7,149,269 | B2 | 12/2006 | Cranford, Jr. et al. |
| 7,457,393 | B2 | 11/2008 | Casper et al. |
| 7,855,582 | B2 | 12/2010 | Schabel |
| 8,135,100 | B2 | 3/2012 | Beukema et al. |
| 8,774,337 | B2 | 7/2014 | Lee et al. |
| 8,791,735 | B1 | 7/2014 | Shibasaki |
| 8,798,219 | B2 | 8/2014 | Buchwald et al. |
| 8,804,889 | B2 | 8/2014 | Palusa et al. |
| 2006/0224339 | A1 | 10/2006 | Kim et al. |
| 2007/0253475 | A1 | 11/2007 | Palmer |

(Continued)

*Primary Examiner* — Leila Malek
(74) *Attorney, Agent, or Firm* — Fenwick & West LLP

(57) ABSTRACT

A receiver with clock phase calibration is disclosed. A first sampling circuit generates first digital data based on an input signal, a sampling phase of the first sampling circuit controlled by a first clock signal. A second sampling circuit generates second digital data based on the input signal, a sampling phase of the second sampling circuit controlled by a second clock signal. Circuitry within the receiver calibrates the clocks in different stages. During a first calibration stage, a phase of the second clock signal is adjusted while the first digital data is selected for generating the output data. During a second calibration stage, a phase of the first clock signal is adjusted while the first digital data is selected for the output data path.

20 Claims, 5 Drawing Sheets

(56) References Cited

U.S. PATENT DOCUMENTS

| | | |
|---|---|---|
| 2010/0289544 A1 | 11/2010 | Lee et al. |
| 2010/0322367 A1 | 12/2010 | Wenske et al. |
| 2011/0267122 A1* | 11/2011 | Jeong .................... H03L 7/0807 |
| | | 327/165 |
| 2014/0169438 A1 | 6/2014 | Lin et al. |

* cited by examiner

- ● Main DFE clock (DCLK)
- ▲ Adaptive DFE clock (ACLK)
- ★ Edge clock (ECLK)

Stg1: select main data as output data and adjust adaptive clock
302

Stg2: select adaptive data as output data and adjust main clock
304

Stg3: Compensate adaptive phase code to align main and adaptive clocks
306

PHASE CALIBRATION OF CLOCK SIGNALS

CROSS REFERENCE TO RELATED APPLICATIONS

This application is a continuation of U.S. patent application Ser. No. 15/659,394 filed on Jul. 25, 2017, which is a continuation of U.S. patent application Ser. No. 15/176,864 filed on Jun. 8, 2016, which claims the benefit of U.S. Provisional Patent Application No. 62/187,742, filed on Jul. 1, 2015, each of which is incorporated by reference in its entirety.

BACKGROUND

High speed serial receivers are responsible for recovering data from a noisy input signal. However, as signaling rates increase, the receivers become more sensitive to process variations, voltage drift, and temperature drift.

BRIEF DESCRIPTION OF THE DRAWINGS

The teachings of the embodiments herein can be readily understood by considering the following detailed description in conjunction with the accompanying drawings.

DETAILED DESCRIPTION OF EMBODIMENTS

Figure 1:
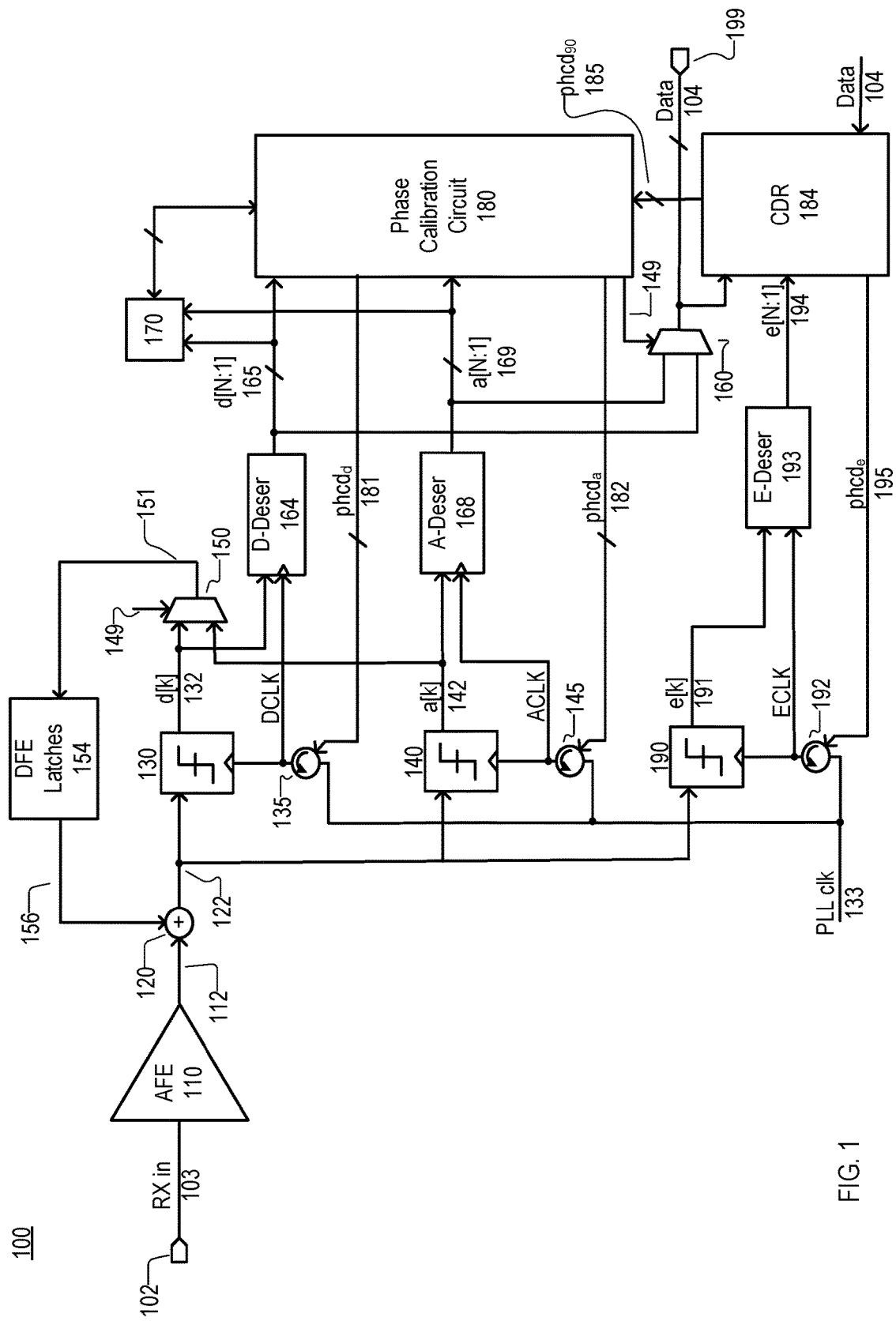
FIG. 1 is a receiver with live clock phase calibration, according to an embodiment of the present disclosure.

Reference will now be made in detail to several embodiments of the present disclosure, examples of which are illustrated in the accompanying figures. It is noted that wherever practicable similar or like reference numbers may be used in the figures and may indicate similar or like functionality. The figures depict embodiments of the present disclosure for purposes of illustration only. One skilled in the art will readily recognize from the following description that alternative embodiments of the structures and methods illustrated herein may be employed without departing from the principles, or benefits touted, of the disclosure described herein.

An embodiment of the present disclosure relates to a receiver with clock phase calibration. The receiver includes a main DFE (decision feedback equalizer) data sampler under control of a main DFE clock signal, and an adaptive DFE data sampler under control of an adaptive DFE clock signal. The main clock signal and the adaptive clock signal may have a phase mismatch caused by unequal clock paths, voltage drifts, temperature drifts and process variations. This mismatch can negatively affect the operation of the receiver. To address this mismatch, the receiver aligns the main clock signal and adaptive clock signal with a live phase calibration that can occur during live data traffic.

In one embodiment, the receiver comprises a first sampling circuit (e.g. main sampler) to generate first digital data based on an input signal, a sampling phase of the first sampling circuit controlled by a first clock signal. The receiver also comprises a second sampling circuit (e.g. adaptive sampler) to generate second digital data based on the input signal, a sampling phase of the second sampling circuit controlled by a second clock signal. The receiver also comprises circuitry that performs a calibration process to align a phase of the first and second clock signals. During a first calibration stage, the first digital data is selected for generating the output data of the receiver and a phase of the second clock signal is adjusted. The adjustment occurs while the first digital data is selected for the output data. During a second calibration stage, the second digital data is selected for generating the output data of the receiver and a phase of the first clock signal is adjusted. The adjustment occurs while the second digital data is selected for the output data. During a third calibration stage, a phase error value representing a difference between the adjusted phase values for the first clock signal and the second clock signal can be used to align the two clock signals. By selectively alternating between using either the first digital data or the second digital data as the output data, the phases of the first and second clock signals can be aligned during live data traffic without interrupting the data stream.

In one embodiment, a non-transitory computer readable medium storing a representation of the receiver is disclosed. In another embodiment, a method of operation in the receiver is disclosed.

FIG. 1 is a receiver 100 with live clock phase calibration, according to an embodiment of the present disclosure. The receiver 100 may be found on-chip in an integrated circuit (IC). The receiver 100 includes an input terminal 102 coupled to a serial communication channel. The input terminal 102 receives an analog input signal 103 from a remote transmitter via the serial communication channel. The receiver 100 recovers data from the analog input signal 103, which is provided as output data 104 at output node 199. In other embodiments the analog input signal 103 can be provided by a local source inside the receiver 100 during calibration.

As shown, the receiver 100 includes an analog front end (AFE) 110, decision feedback equalizer (DFE) summer 120, main sampler 130, adaptive sampler 140, edge sampler 190, main clock phase adjustment circuit 135, adaptive clock phase adjustment circuit 145, edge clock phase adjustment circuit 192, DFE multiplexer 150, output selection multiplexer 160, DFE latches 154, main data deserializer 164, adaptive data deserializer 168, edge data deserializer 193, clock data recovery (CDR) circuit 184, phase calibration circuit 180 and adaptation circuit 170. Each of these components can be implemented using one or more circuits.

Analog front end (AFE) 110 applies analog signal processing to the received analog input signal 103 to generate a conditioned analog input signal 112 at an output of the AFE 110. AFE 110 can include, for example, a linear equalizer (LEQ) that equalizes the input signal 103, and a variable gain amplifier (VGA) that amplifies the output of the LEQ, thereby generating conditioned analog input signal 112.

DFE summer 120 combines the conditioned analog input signal 112 with one or more DFE feedback signals 156 from the DFE latches 154. The DFE feedback signals 156 indicate an amount of equalization to be applied to the conditioned analog input signal 112. The output of the DFE summer 120 is an equalized analog input signal 122 that represents a sum of the conditioned analog input signal 112 and the DFE feedback signals 156.

Main sampler 130 samples the equalized analog input signal 122, and generates digital data from the data samples that is output as serialized main data 132. The sampling phase of the main data sampler 130 is controlled by edges of the main clock signal DCLK. Main data de-serializer 164 deserializes the main data 132, thereby generating parallel main data 165. Main sampler 130 represents a main data path of the receiver 100. As used herein, main data may generally refer to either the serialized main data 132 or the parallel main data 165.

Adaptive sampler 140 samples the equalized analog input signal 122, and generates digital data from the data samples that is output as serialized adaptive data 142. The sampling phase of the adaptive sampler 140 is controlled by edges of the adaptive clock signal ACLK. Adaptive data de-serializer 168 then deserializes the adaptive data 142, thereby generating parallel adaptive data 169. Adaptive sampler 140 represents a secondary adaptive data path through the receiver 100 that generates data for adaptation functions. As used herein, adaptive data may generically refer to either the serialized adaptive data 142 or the parallel adaptive data 169.

Edge sampler 190 also samples the equalized analog input signal 122, and generates serialized edge data 191 from the data samples. The sampling phase of the edge sampler 190 is controlled by edges of the edge clock signal ECLK. Edge data de-serializer 193 then deserializes the edge data 191, thereby generating parallel edge data 194.

The main sampler 130, adaptive sampler 140 and edge sampler 191 can all be data slicing latches that make data decisions as to whether a sample of the equalized analog input signal 122 at a given point in time represents a digital data value of "0" or "1". For example, an input voltage below a decision threshold can result in a "0" and voltages above the decision threshold can result in a "1". The data decision is output as digital data indicating whether a voltage of the sample is higher or lower than the decision threshold.

Main clock phase adjustment circuit 135 receives base PLL clock signals 133 and generates the main data clock signal DCLK from the base phase lock loop (PLL) clock signals 133. Main clock phase adjustment circuit 135 adjusts a phase of the main clock signal DCLK in accordance with a main phase code 181. The main phase code 181 is a multi-bit digital value indicating a target phase adjustment of the main clock signal DCLK. Typically edges of the main clock signal DCLK are set to be near the middle of the data eye.

Similarly, adaptive clock phase adjustment circuit 145 receives base PLL clock signals 133 and generates the adaptive clock signal ACLK from the base PLL clock signals 133. Adaptive clock phase adjustment circuit 145 adjusts a phase of the adaptive clock signal ACLK in accordance with an adaptive phase code 182. The adaptive phase code 182 is a multi-bit digital value indicating a target phase adjustment of the adaptive clock signal ACLK. Typically edges of the adaptive clock signal ACLK are set to be near the middle of the data eye for the purpose of performing the EQ adaptation function.

Also, edge clock phase adjustment circuit 192 receives base PLL clock signals 133 and generates the edge clock signal ECLK from the base PLL clock signals 133. Edge clock phase adjustment circuit 192 adjusts a phase of the edge clock signal ECLK in accordance with an edge phase code 195. The edge phase code 195 is a multi-bit digital value indicating a target phase adjustment of the edge clock signal ECLK. Typically edges of the edge clock signal ECLK are set to be near the edges of the data eye.

In one embodiment, the clock phase adjustment circuits 135, 145 and 192 are phase interpolators. A phase interpolator generates an output clock by interpolating between two different base PLL clocks 133 having different phases. The amount of the interpolation, and therefore degree of phase shift in the output clock, is controlled by a corresponding phase code.

The DFE selection multiplexer (MUX) 150 selects either the serialized main data 132 or the serialized adaptive data 142 as feedback data 151. The DFE latches 154 delay the feedback data 151, weight the delayed data with DFE tap coefficients, and combine the weighted delayed data into a DFE feedback signal 156.

The adaptation circuit 170 receives and uses both the parallel main data 165 and the parallel adaptive data 169 to adjust operating parameters of the receiver 100 to adapt to changing conditions within the receiver (e.g. supply voltage changes, temperature changes, changes in the input signal 103, etc.) During EQ adaptation, coefficients of the LEQ (not shown) within the AFE 110, coefficients of the DFE latches 154, or coefficients of the remote transmitter (not shown) are adjusted in order to maximize the eye opening (or voltage and timing margins of the signal) at the input to the sampler circuits 130, 140 and 190. Both the main data 165 and the adaptive data 169 may be used in computing the optimal coefficients. Adaptation circuit 170 and phase calibration circuit 180 may need to communicate with each other to ensure that clock phase calibration and EQ adaptation are not performed at the same time, since they both use the same hardware (main and adaptive samplers).

The data output selection multiplexer (MUX) 160 selectively generates the output data 104 for the output data path from the main data of the main data path or the adaptive data of the adaptive data path. Specifically, the data output selection MUX 160 receives the parallel main data 165 and the parallel adaptive data 169, and selects one of the two inputs to pass through as the output data 104. The selection is controlled by the state of an output selection signal 149 generated by the phase calibration circuit 180. In other embodiments the state of the output selection signal 149 may be controlled by other circuitry in the receiver 100.

The output selection signal 149 is also provided to the DFE selection MUX to control the selection of the feedback data 151. Thus, when the output data 104 is generated from the main data, the feedback data is also generated from the main data. When the output data 104 is generated from the adaptive data instead of the main data, the feedback data 151 is also generated from the adaptive data instead of the main data.

Clock and data recovery (CDR) circuit 184 uses the output data 104 and the edge data 194 to detect edges in the equalized analog input signal 122 and to generate an edge phase code 195 that aligns the edge clock ECLK with the those edges. Once locked on to the edges, the CDR also outputs another phase code 185 that represents a 90 degree phase offset from the edge phase code 195.

Initially, the phase calibration circuit 180 uses phase code 185 as the main phase code 181 and the adaptive phase code 182. In an ideal system, setting the main phase code 181 and the adaptive phase code 182 to the same phase code 185 should (1) cause edges of the main clock DCLK and the adaptive clock ACLK to be aligned with each other and (2) cause the edges of the main data DCLK and adaptive clock ACLK to be in the middle of the data eye for maximum sampling margin. However, phase variations between the main data clock DCLK and the adaptive data clock ACLK can occur due to different clock path lengths, process variations, voltage drift, and temperature drift. These phase variations can cause errors in the functions of the adaptation circuit 170.

Figure 2:
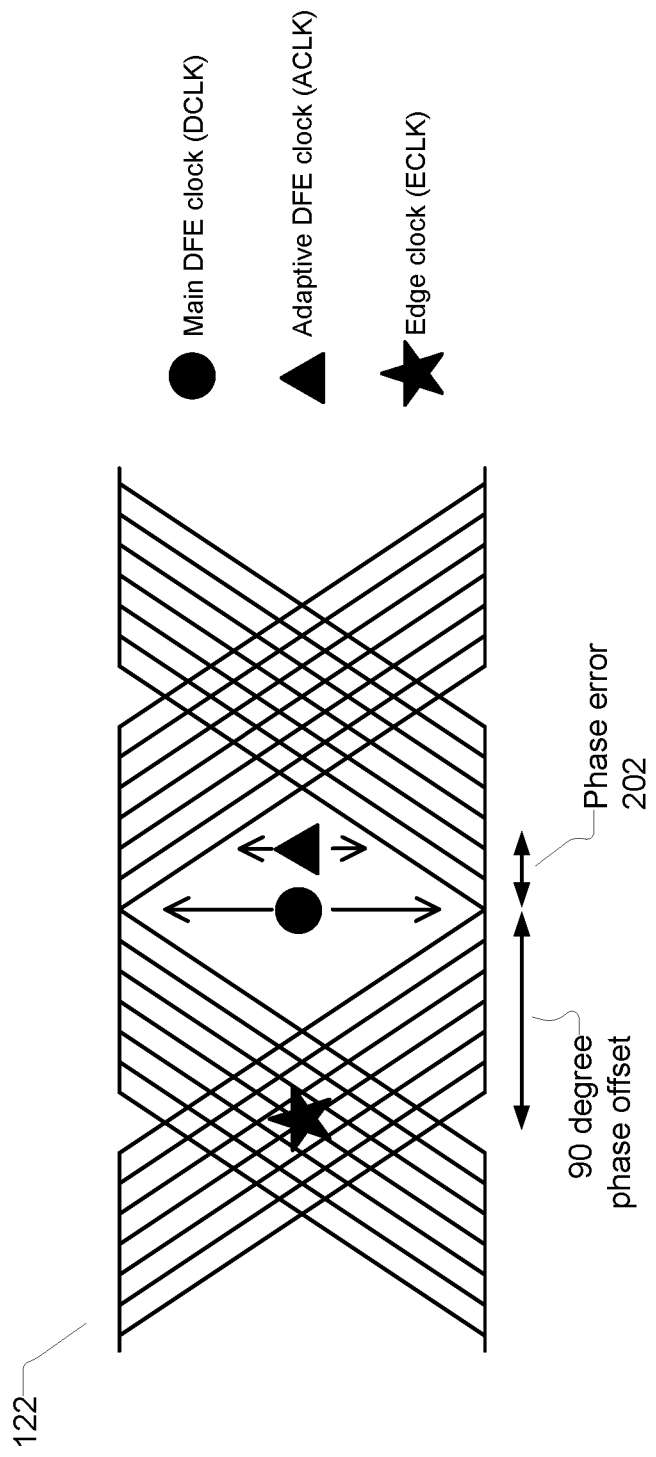
FIG. 2 is a data eye of the equalized analog input signal from FIG. 1, according to an embodiment of the present disclosure.

Referring to FIG. 2, illustrated is a data eye of the equalized analog input signal 122, according to an embodiment. FIG. 2 represents the problem to be solved by the receiver of FIG. 1. The symbols represent the sampling points for different clocks: the main clock DCLK, the adaptive clock ACLK and an edge clock ECLK. An edge clock ECLK is aligned with the transitions of the data eye. The main clock DCLK is in the middle of the data eye and is offset from the edge clock ECLK by a 90 degree phase offset. Ideally, the adaptive clock ACLK should be in the same position as the main clock DCLK. However, ACLK has a phase error 202 and is slightly later in time than the main clock DCLK, which causes the adaptive data path to have less signal margin than the main data path.

Referring back to FIG. 1, phase calibration circuit 180 performs a calibration operation to align the edges of the main clock signal DCLK and the adaptive clock signal ACLK. The calibration can be performed periodically during live data traffic by selecting the main data for generating the output data 104 while adjusting the adaptive phase code 182 until the adaptive clock signal ACLK is aligned with transitions of the data eye. Then the adaptive data can be selected for generating the output data 104 while adjusting the main phase code 181 until the main clock signal DCLK is aligned with transitions of the data eye. A difference between the adjusted phase codes represents a phase error between the adaptive phase code 182 and the main phase code 181. Either the adaptive phase code 182 or the main phase code 181 can be adjusted by this phase error to align the main clock DCLK and the adaptive clock ACLK. By selectively generating the output data 104 from either the main data or adaptive data, the calibration can be performed during live data traffic without causing any interruptions in the data stream. Alternatively or additionally, the calibration may also be performed during initialization of the receiver 100.

Figure 3A:
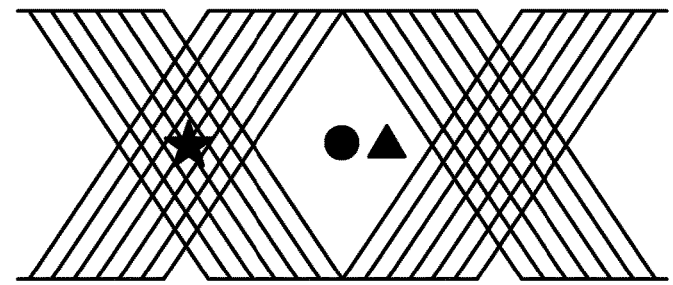
FIG. 3A is a flowchart illustrating a calibration process performed in the receiver of FIG. 1, according to an embodiment of the present disclosure.
Figure 3A:
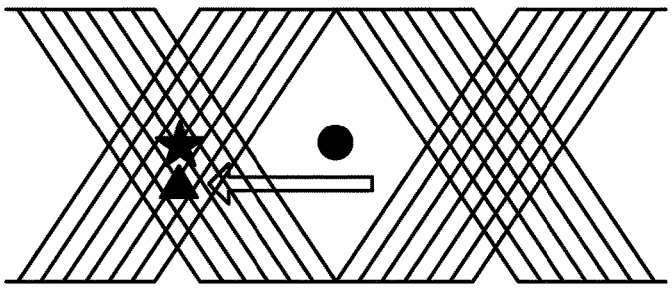
Figure 3A:
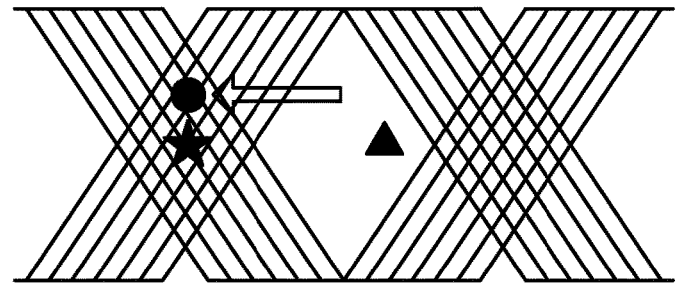
Figure 3A:
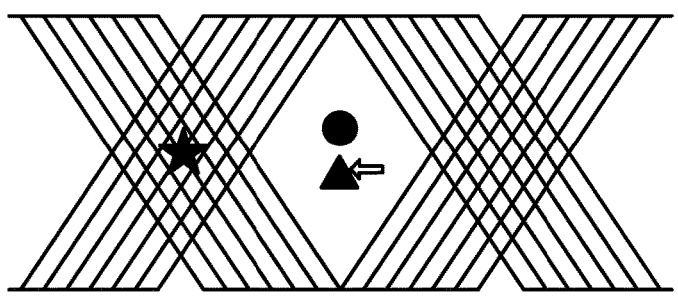

Calibration is now explained in greater detail by reference to FIGS. 3A and 3B. FIG. 3A is a flowchart illustrating a calibration process performed in the receiver 100 of FIG. 1, according to an embodiment. In one embodiment, phase calibration circuit 180 may be a state machine that implements the operations of FIG. 3A.

The phase calibration is performed in stages. During the initial calibration stage 302, the output selection MUX 160 selects the main data as the output data 104 for the output data path. The phase of the adaptive clock signal ACLK is then adjusted incrementally, via adjustment of adaptive phase code 182, until main data differs from the adaptive data. A difference in the data indicates that the adaptive clock signal ACLK is now aligned with data transitions of the data eye and so the final aligned value of the adaptive phase code 182 is saved for later use.

During the adjustment process, the main data may be filtered for a specific reference data pattern and calibration is only allowed to proceed when the data pattern is detected. The adjustment can also be repeated multiple times, and the final phase value can be averaged over multiple iterations to produce an averaged phase value for the adaptive phase code 182.

Figure 4:
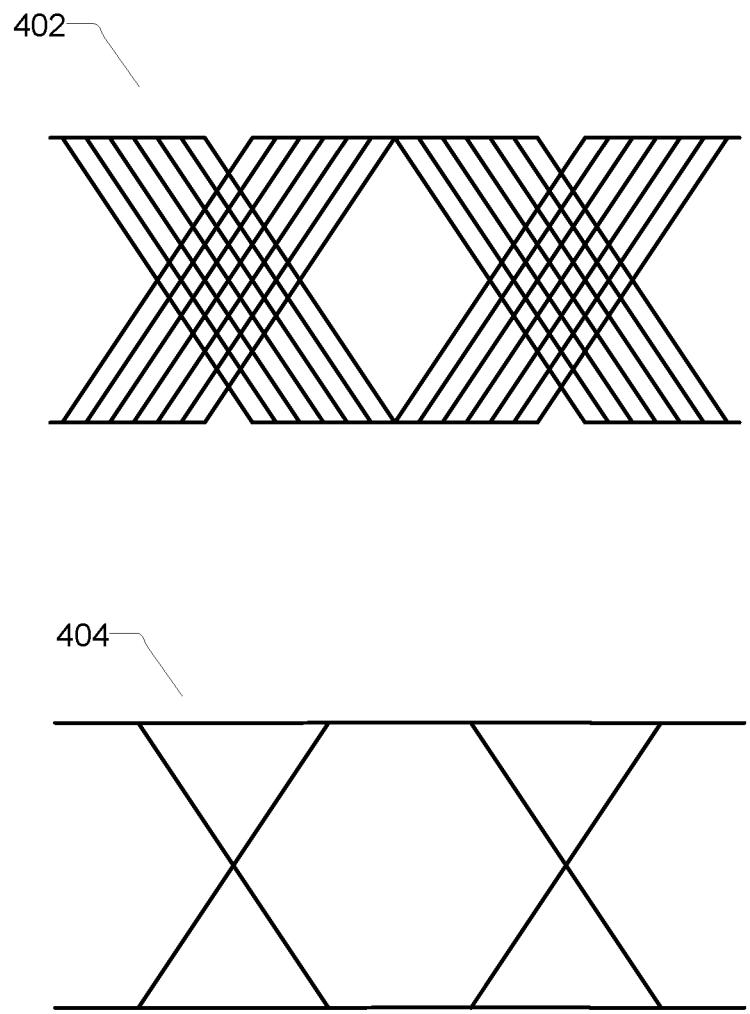
FIG. 4 is a data eye for unfiltered data and a data eye for filtered data, according to an embodiment of the present disclosure.

The reference data pattern is typically a repeating clock-like bit pattern, such as "10101010". This data pattern typically indicates that the received input signal 103 has predictable edges with little to no intersymbol interference (ISI) and is therefore appropriate for use in calibration. Referring briefly to FIG. 4, illustrated is a data eye 402 for unfiltered data and a data eye 404 for filtered data. The first data eye 402 for unfiltered data has a large amount of spread in its edges. However, the second data eye 404 for the filtered data has a smaller spread in its edges. Performing calibration with the filtered data increases the accuracy of the phase calibration due to the smaller spread of the data transitions indicated by the edges.

Referring back to FIG. 3A, during the next calibration stage 304, the output selection MUX 160 selects the adaptive data as the output data 104 for the output data path. The phase of the adaptive clock signal ACLK is returned to its original phase. The phase of the main clock signal DCLK is then adjusted incrementally, via adjustment of the main phase code 181, until the main data differs from the adaptive data. A difference in the data indicates that the main clock signal DCLK is now aligned with data transitions of the data eye, and so the final aligned value of the main phase code 181 is saved for later use. During the adjustment process, the adaptive data may be filtered for a specific data pattern and calibration is only allowed to proceed when the data pattern is detected, as will later be explained by reference to FIG. 3B. The adjustment can also be repeated multiple times, and the final phase value can be averaged over multiple iterations to produce an averaged phase value for the main phase code 181.

During the last calibration stage 306, compensation is applied to the adaptive phase code 182 to align the main clock signal DCLK and the adaptive clock signal ACLK. Specifically, a difference between the final averaged adaptive phase code 182 obtained in stage 1 and the final averaged main phase code 181 obtained in stage 2 is computed. The difference is a phase error correction value representing an unwanted offset between the main clock signal DCLK and the adaptive clock signal ACLK. The difference is then combined with the default value of the adaptive phase code 182 to eliminate the unwanted offset, which aligns the phase of the main clock signal DCLK and adaptive clock signal ACLK. In another embodiment the difference is averaged over multiple runs before it is combined with the default value of the adaptive phase code 182. In other embodiments, the compensation can be applied to the main phase code 181 instead of the adaptive phase code 182.

Figure 3B:
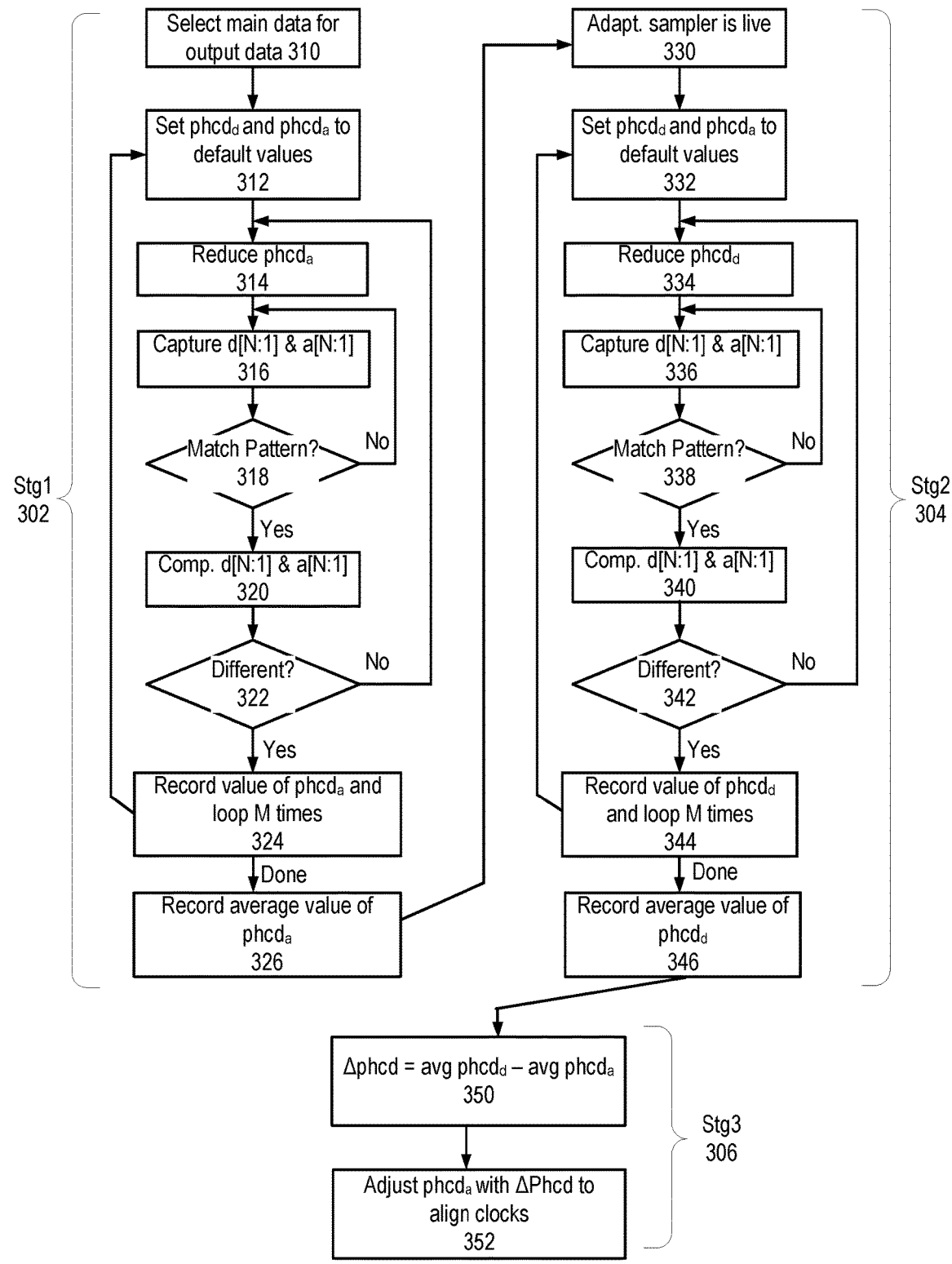
FIG. 3B is a flowchart illustrating a more detailed view of the calibration process from FIG. 3A, according to an embodiment of the present disclosure.

FIG. 3B is a flowchart illustrating a more detailed view of the calibration process from FIG. 3A, according to an embodiment of the present disclosure. Calibration stage 1 302 is represented by steps 310-326. Calibration stage 2 304 is represented by steps 330-346. Calibration stage 3 306 is represented by steps 350-352.

Calibration stage 1 302 is first explained. In step 310, the main data is selected as the output data 104 via the output selection signal 149. This also results in the main data being selected as the feedback data 151 for the DFE latches 154.

In step 312, the main phase code 181 and the adaptive phase code 182 are set to their default value (i.e. phase code value 185 from FIG. 1). The default value causes the main clock signal DCLK to have a ~90 degree phase offset from the edge clock signal ECLK. Adaptive clock signal ACLK has an error phase offset from the main clock signal DCLK.

The error phase offset is due to temperature drift, voltage drift, etc. The phase offsets are illustrated, for example, in FIG. 2.

In step 314, the adaptive phase code 182 is reduced by one or more steps to move the adaptive clock signal ACLK towards the edge clock signal ECLK.

In step 316, several bits of the main data and adaptive data are captured. In step 318, the main data bits are compared against a reference data pattern. The reference data pattern is typically a repeating clock-like bit pattern, such as "10101010". This data pattern typically indicates that the received input signal 103 has predictable edges with little to no intersymbol interference (ISI) and is therefore appropriate for use in calibration. The comparison can be performed with a comparator circuit. The result of step 318 is a filtered version of the main data.

If the reference data pattern is not matched, the process returns to step 316 to capture additional data. If the reference data pattern is matched, the process then proceeds to step 320 where the filtered version of the main data and adaptive data are compared against one another. The comparison can be performed with a comparator circuit.

In step 322, the result of the comparison is evaluated to determine if the filtered version of the main data and adaptive data are the same or different from each other. If the filtered version of the main data and adaptive data are the same, this indicates that the adaptive clock signal ACLK is not yet aligned with the edges of the data eye. The process then returns to step 314 to reduce the adaptive phase code 182 further. On the other hand, if the filtered version of the main data and adaptive data are different, this indicates that the adaptive clock signal ACLK is now aligned with the transitions of the data eye. The process then proceeds to step 324, where the final value of the adaptive phase code 182 is stored in temporary memory. The process also returns to step 312 and loops M number of times, M being an integer greater than 1.

In step 326, the average of the adaptive phase code values recorded in step 324 is determined. The average value of the adaptive phase code 182 is then recorded for use in stage 3 306. Averaging the value of the adaptive phase code 182 over multiple loops increases the accuracy of the calibration by avoiding error due to temporal device and supply noise.

Calibration stage 2 302 is now explained. Steps 330 through 346 are similar to steps 310 through 326, but now the adaptive data is selected for the output data 151 instead of the main data 132. Additionally, the main clock signal DCLK is adjusted instead of the adaptive clock signal ACLK.

In step 330 the adaptive data is selected as the output data 104 via the output selection signal 149. This also results in the adaptive data being selected as the feedback data 151 for the DFE latches 154.

In step 332, the main phase code 181 and the adaptive phase code 182 are set to their default values (i.e. phase code value 185 from FIG. 1). The default values cause the main clock signal DCLK to have a ~90 degree phase offset from the edge clock signal ECLK. Adaptive clock signal ACLK has an error phase offset from the main clock signal DCLK.

In step 334, the main phase code 181 is reduced to move the main clock signal DCLK towards the edge clock signal ECLK.

In step 336, the main data and adaptive data are captured. In step 338, the adaptive data is compared against a reference data pattern. The comparison can be performed with a comparator circuit.

If the reference data pattern is not matched, the process returns to step 336 to capture additional data. If the reference data pattern is matched, the process then proceeds to step 340 where the main data and adaptive data are compared against one another. The comparison can be performed with a comparator circuit.

The result of step 338 is a filtered version of the adaptive data 169. In step 342, the result of the comparison is evaluated to determine if the main data and filtered version of the adaptive data are the same or different from each other. If the main data and filtered version of the adaptive data are the same, this indicates that the main clock signal DCLK is not yet aligned with edges of the data eye. The process then returns to step 334 to reduce the main phase code 181 further. On the other hand, if the main data and adaptive data are different, this indicates that the main clock signal DCLK is now aligned with transitions of the data eye. The process then proceeds to step 344, where the final phase code value of the main phase code 181 is stored. The process then returns to step 332 and loops M number of times.

In step 346, the average of the main phase code values recorded in step 344 is determined. The average value of the main phase code 181 is then recorded for use in stage 3 306. Averaging the value of the main phase code 181 over multiple loops increases the accuracy of the calibration.

Calibration stage 3 306 is now explained. In step 350, a phase error correction value Δphcd is determined as the difference between the average main phase code value (from step 346) and the average adaptive phase code value (from step 326). The phase error correction value represents the magnitude of the phase error between the main clock signal DCLK and the adaptive clock signal ACLK (i.e., the phase error 202 from FIG. 2). The difference may be computed with a subtraction circuit. In some embodiments, the difference can be averaged over multiple runs to generate a final phase error correction value.

In step 352, the default value of the adaptive phase code 182 is adjusted by the phase error correction value Δphcd. The adjustment to the adaptive phase code 182 eliminates the phase error offset between the main clock signal DCLK and the adaptive clock signal ACLK, thereby aligning a phase of the main clock signal DCLK and the adaptive clock signal ACLK. The adjustment can occur by way of a summer circuit that combines the phase error correction value Δphcd with the default phase code 185.

In one embodiment, a representation of circuits within the receiver may be stored as data in a non-transitory computer-readable medium (e.g. hard disk drive, flash drive, optical drive). These representations may in the form of, for example, behavioral level descriptions, register transfer level descriptions, logic component level descriptions, transistor level descriptions or layout geometry-level descriptions.

Upon reading this disclosure, those of skill in the art may appreciate still additional alternative designs for a receiver with live phase calibration of main and adaptive clocks. Thus, while particular embodiments and applications of the present disclosure have been illustrated and described, it is to be understood that the disclosure is not limited to the precise construction and components disclosed herein. Various modifications, changes and variations which may be apparent to those skilled in the art may be made in the arrangement, operation and details of the method and apparatus of the present disclosure herein without departing from the spirit and scope of the disclosure as defined in the appended claims.

What is claimed is:

1. A receiver with clock phase calibration, the receiver comprising:
    a first sampler configured to sample an input signal according to a first sampling phase that is based on a first clock signal and generate first digital data based on the input signal sampled according to the first sampling phase;
    a first deserializer configured to deserialize the first digital data generated by the first sampler;
    a second sampler configured to sample the input signal according to a second sampling phase that is based on a second clock signal and generate second digital data based on the input signal sampled according to the second sampling phase;
    a second deserializer configured to deserialize the second digital data generated by the second sampler;
    a multiplexor configured to receive the deserialized first digital data generated by the first sampler and the deserialized second digital data generated by the second sampler and select either the deserialized first digital data or the deserialized second digital data as output data by the receiver based on an output selection signal; and
    a phase calibration circuit to generate the output selection signal.

2. The receiver of claim 1, wherein the phase calibration circuit is further configured to:
    generate the output selection signal selecting the deserialized first digital data for output by the receiver during a first calibration state and determine an average of a plurality of first phase errors between the first clock signal and the second clock signal while the output data based on the deserialized first digital data is generated during the first calibration state;
    generate the output selection signal selecting the deserialized second digital data for output by the receiver during a second calibration state and determine an average of a plurality of second phase errors between the first clock signal and the second clock signal while the output data based on the deserialized second data is generated during the second calibration state; and
    adjust at least one of the first sampling phase of the first sampler or the second sampling phase of the second sampler based on a comparison between the average of the plurality of first phase errors and the average of the plurality of second phase errors.

3. The receiver of claim 2, further comprising:
    a first clock phase adjustment circuit to adjust the first sampling phase of the first clock signal based on a first phase code;
    a second clock phase adjustment circuit to adjust the second sampling phase of the second clock signal based on a second phase code; and
    wherein the phase calibration circuit is configured to adjust the second phase code during the first calibration state, and to adjust the first phase code during the second calibration stage.

4. The receiver of claim 3, wherein the phase calibration circuit is configured to:
    adjust, during the first calibration state, the second phase code until the second phase code reaches a second phase code value corresponding to an alignment between the second clock signal and edges of the input signal;
    adjust, during the second calibration state, the first phase code until the first phase code reaches a first phase code value corresponding to an alignment between the first clock signal and edges of the input signal;
    determine a phase correction value indicative of a difference between the first phase code value and the second phase code value; and
    align the first clock signal and the second clock signal based on the phase correction value.

5. The receiver of claim 3, wherein the first clock phase adjustment circuit is a first phase interpolator, and the second clock phase adjustment circuit is a second phase interpolator.

6. The receiver of claim 2, further comprising:
    a decision feedback equalizer (DFE) summing circuit configured to generate the input signal based on a DFE feedback signal; and
    a plurality of DFE latches configured to generate the DFE feedback signal based on the first digital data during the first calibration state and to generate the DFE feedback signal based on the second digital data during the second calibration state.

7. The receiver of claim 3, further comprising:
    a third sampler configured to sample the input signal according to a third sampling phase that is based on a third clock signal and generate third digital data based on the input signal sampled according to the third sampling phase; and
    a third deserializer configured to deserialize the third digital data generated by the third sampler, the deserialized third digital data indicative of edges in the input signal.

8. The receiver of claim 7, further comprising:
    a clock and data recovery (CDR) circuit configured to receive the output data from the multiplexor and the deserialized third digital data from the third deserializer to generate an edge phase code that phase aligns the third clock signal with the edges in the input signal.

9. The receiver of claim 8, wherein the CDR circuit is further configured to output to the phase calibration circuit a phase code representing a 90 degree phase offset from the edge phase code.

10. The receiver of claim 9, wherein the phase code representing the 90 degree phase offset from the edge phase code is initially used as the first phase code and the second phase code.

11. A method of operation in a receiver, the method comprising:
    sampling an input signal according to a first sampling phase that is based on a first clock signal;
    generating first digital data based on the input signal sampled according to the first sampling phase;
    deserializing the first digital data;
    sampling the input signal according to a second sampling phase that is based on a second clock signal;
    generating second digital data based on the input signal sampled according to the second sampling phase;
    deserializing the second digital data; and
    selecting either the deserialized first digital data or the deserialized second digital data as output data by the receiver based on an output selection signal.

12. The method of claim 11, further comprising:
    generating the output selection signal selecting the deserialized first digital data for output by the receiver during a first calibration state and determining an average of a plurality of first phase errors between the first clock signal and the second clock signal while the output data based on the deserialized first digital data is generated during the first calibration state;

generating the output selection signal selecting the deserialized second digital data for output by the receiver during a second calibration state and determining an average of a plurality of second phase errors between the first clock signal and the second clock signal while the output data based on the deserialized second data is generated during the second calibration state; and adjusting at least one of the first sampling phase or the second sampling phase based on a comparison between the average of the plurality of first phase errors and the average of the plurality of second phase errors.

13. The method of claim 12, further comprising:
adjusting the first sampling phase of the first clock signal based on a first phase code;
adjusting the second sampling phase of the second clock signal based on a second phase code; and
wherein the second phase code is adjusted during the first calibration state, and the first phase code is adjusted during the second calibration state.

14. The method of claim 13, further comprising:
adjusting, during the first calibration state, the second phase code until the second phase code reaches a second phase code value corresponding to an alignment between the second clock signal and edges of the input signal;
adjusting, during the second calibration state, the first phase code until the first phase code reaches a first phase code value corresponding to an alignment between the first clock signal and edges of the input signal;
determining a phase correction value indicative of a difference between the first phase code value and the second phase code value; and
aligning the first clock signal and the second clock signal based on the phase correction value.

15. The method of claim 11, further comprising:
generating a feedback signal based on the first digital data during the first calibration stage and generating the feedback signal based on the second digital data during the second calibration state; and
generating the input signal based on the feedback signal.

16. The method of claim 13, further comprising:
sampling the input signal according to a third sampling phase that is based on a third clock signal;
generating third digital data based on the input signal sampled according to the third sampling phase; and
deserializing the third digital data, the deserialized third digital data indicative of edges in the input signal.

17. The method of claim 16, further comprising:
generating an edge phase code that phase aligns the third clock signal with the edges in the input signal based on the output data and the deserialized third digital data.

18. The method of claim 17, further comprising:
generating a phase code representing a 90 degree phase offset from the edge phase code.

19. The method of claim 18, wherein the phase code representing the 90 degree phase offset from the edge phase code is initially used as the first phase code and the second phase code.

20. The method of claim 12, wherein adjusting at least one of the first sampling phase or the second the sampling phase comprises:
combining a phase error correction value corresponding to the average of the plurality of first phase errors with at least one of a default phase code value corresponding to the first sampling phase of the first clock signal or combining a phase error correction value corresponding to the average of the plurality of second phase errors with at least one of a default phase code value corresponding to the second sampling phase of the second clock signal.

\* \* \* \* \*